United States Patent [19]
Manning

[11] Patent Number: 6,040,221
[45] Date of Patent: Mar. 21, 2000

[54] SEMICONDUCTOR PROCESSING METHODS OF FORMING A BURIED CONTACT, A CONDUCTIVE LINE, AN ELECTRICAL CONNECTION TO A BURIED CONTACT AREA, AND A FIELD EFFECT TRANSISTOR GATE

[75] Inventor: Monte Manning, Boise, Id.

[73] Assignee: Micron Technology, Inc., Boise, Id.

[21] Appl. No.: 08/877,300

[22] Filed: Jun. 16, 1997

Related U.S. Application Data

[62] Division of application No. 08/562,928, Nov. 27, 1995, Pat. No. 5,681,778.

[51] Int. Cl.[7] .................... H01L 21/283; H01L 21/336
[52] U.S. Cl. .................... 438/297; 438/238; 438/453; 438/564; 438/586
[58] Field of Search .................... 438/297, 238, 438/453, 564, 586

[56] References Cited

U.S. PATENT DOCUMENTS

| 4,380,481 | 4/1983 | Shimbo | 438/552 |
|---|---|---|---|
| 4,748,134 | 5/1988 | Holland et al. | 438/440 |
| 5,393,689 | 2/1995 | Pfiester et al. | 438/237 |
| 5,681,778 | 10/1997 | Manning | 438/297 |

FOREIGN PATENT DOCUMENTS

| 018175 A2 | 10/1980 | European Pat. Off. | 438/FOR 346 |
|---|---|---|---|
| 8102493 | 9/1981 | WIPO | 438/FOR 346 |

OTHER PUBLICATIONS

Ghandhi, S.K., VLSI Fabrication Principles, John Wiley & Sons, 1983, pp. 576–582.

*Primary Examiner*—T. N. Quach
*Attorney, Agent, or Firm*—Wells, St. John, Roberts, Gregory & Matkin P.S.

[57] ABSTRACT

A semiconductor processing method of forming a field effect transistor gate over a semiconductor substrate includes forming a gate dielectric layer over substrate active area while a buried contact mask to said active area is in place. A field effect transistor gate is formed over the gate dielectric layer. A semiconductor processing method of forming a conductive line over a substrate active area includes forming a buried contact mask within a substrate active area from only a portion of a prior used field oxide mask. With the buried contact mask in place, a conductive line is formed that overlies the substrate active area. A semiconductor processing method of forming an electrical connection to a buried contact area of a substrate includes forming a buried contact mask in a substrate active area from a prior used field oxide mask. With the buried contact mask in place, a first conductive line is formed over at least some of the active area adjacent the buried contact mask. The buried contact mask is removed to expose a buried contact area. A second conductive line a portion of which overlies the buried contact area is formed to make electrical connection therewith and a portion of which is spaced elevationally from the first conductive line. Other aspects are contemplated.

20 Claims, 6 Drawing Sheets

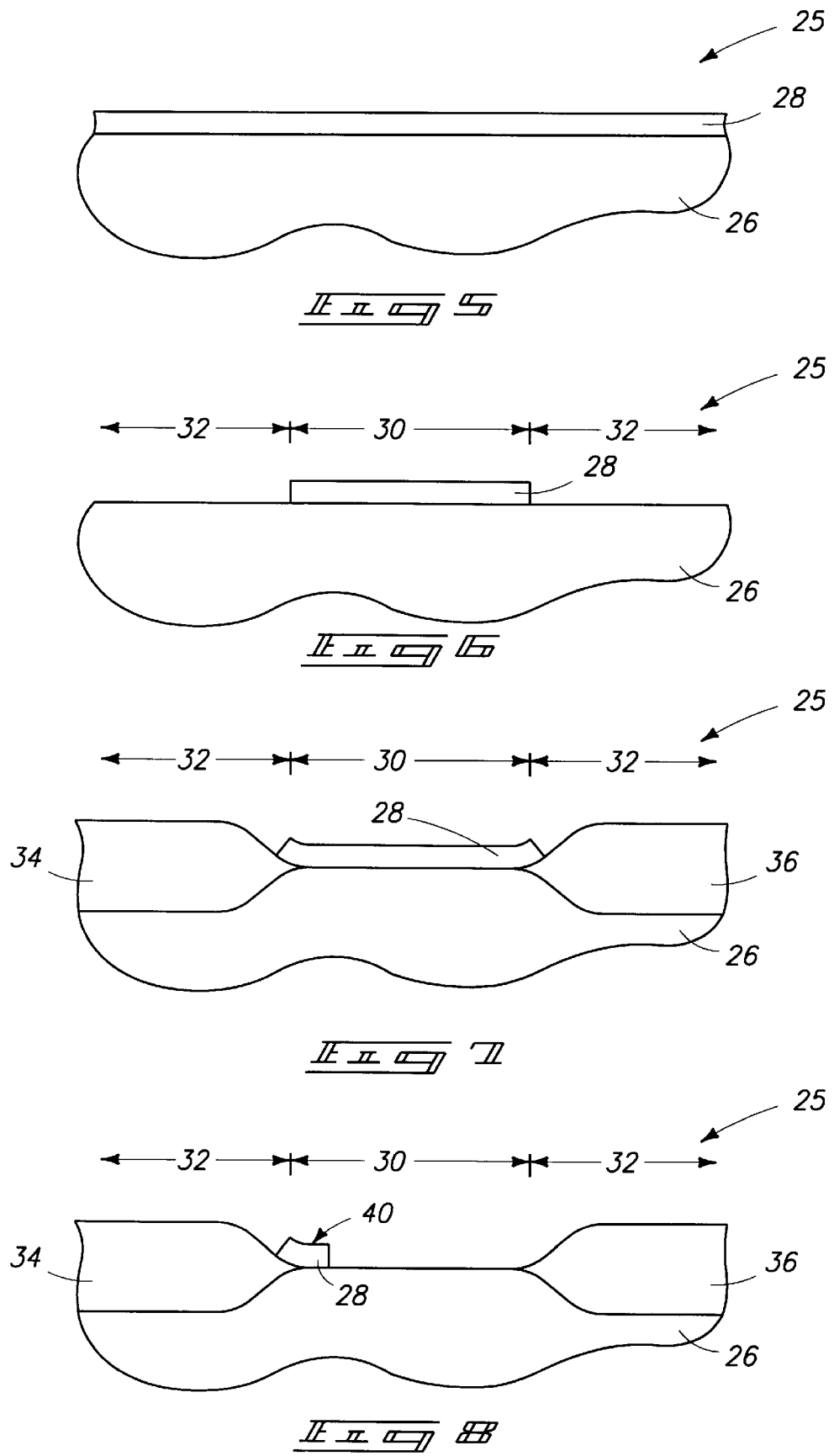

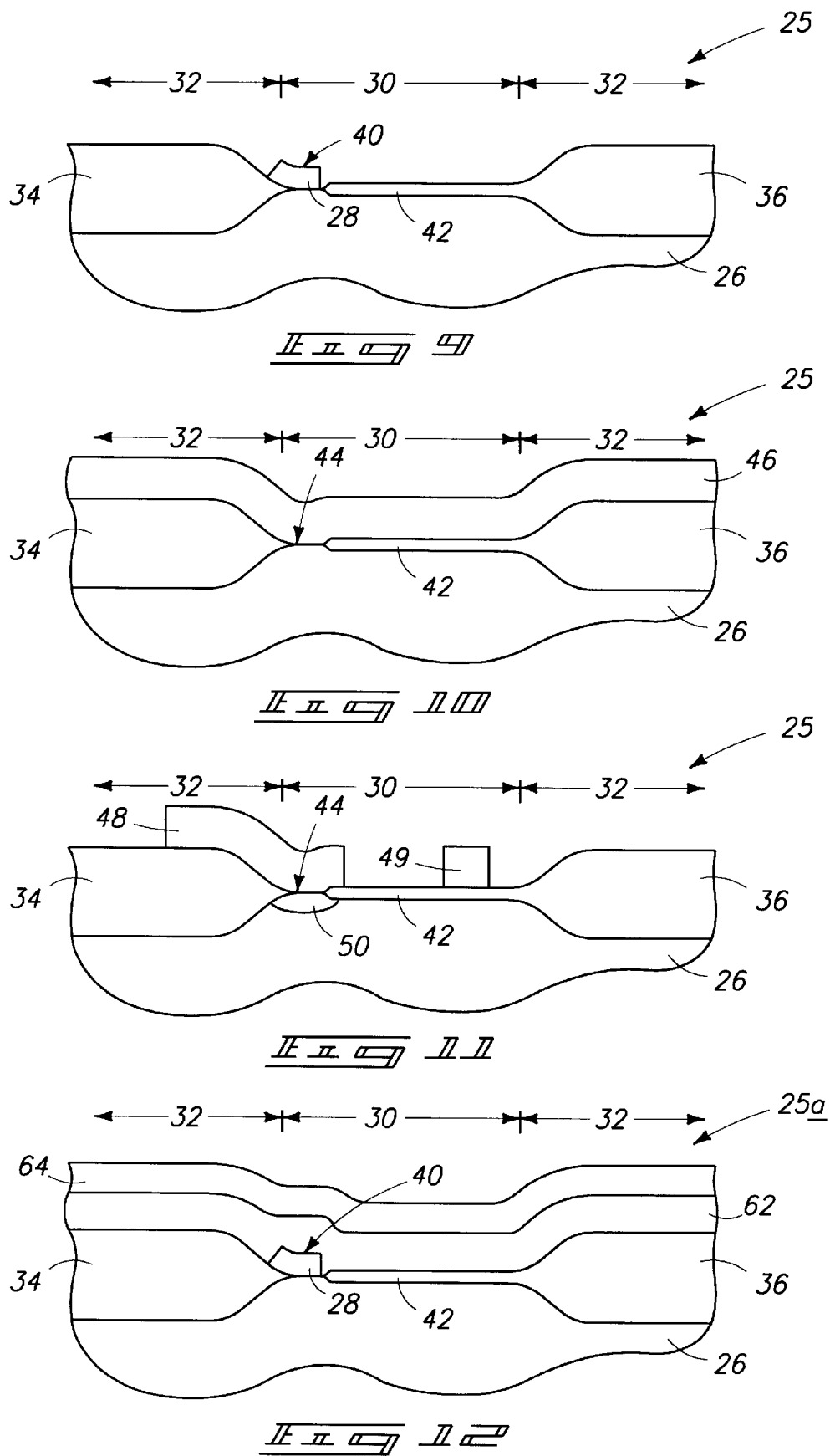

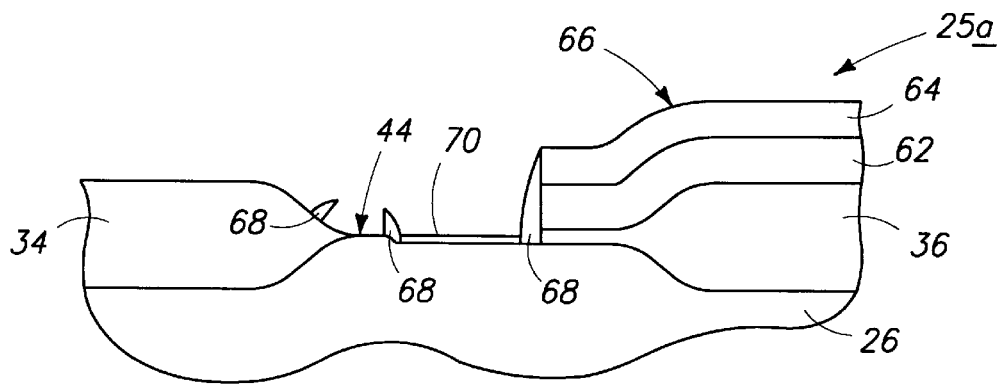
_Fig. 16_
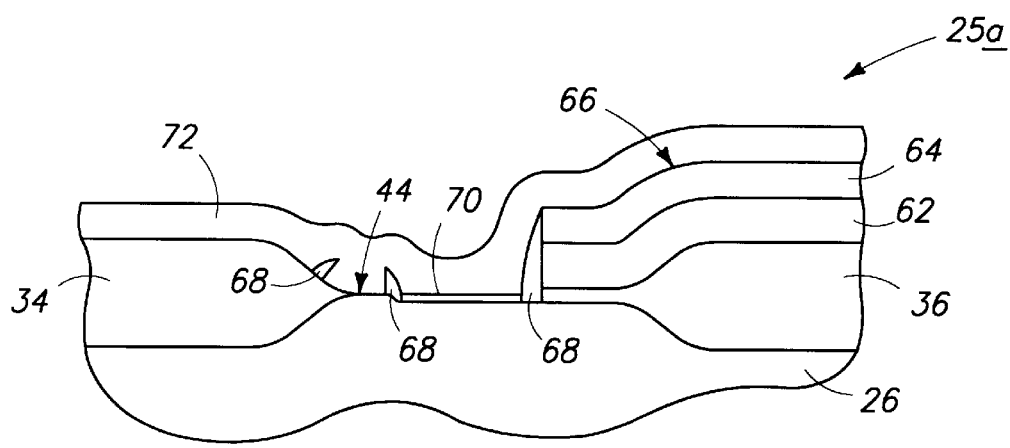
_Fig. 17_
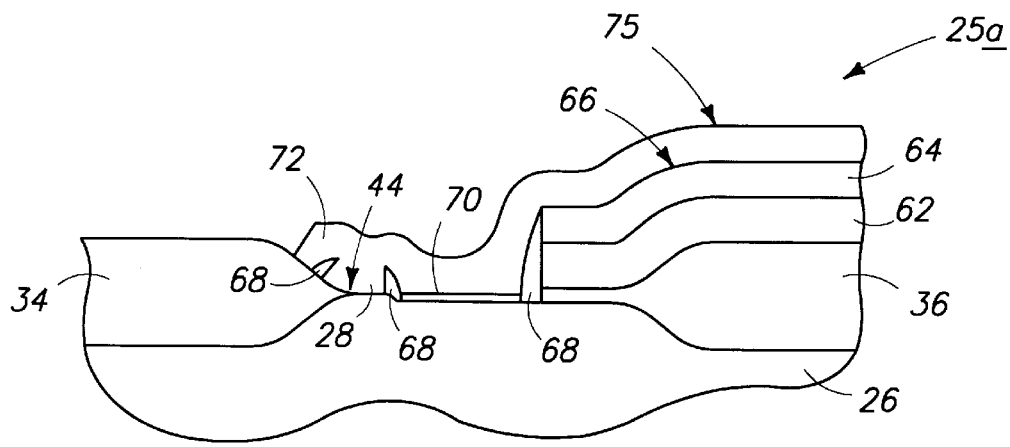
_Fig. 18_

SEMICONDUCTOR PROCESSING METHODS OF FORMING A BURIED CONTACT, A CONDUCTIVE LINE, AN ELECTRICAL CONNECTION TO A BURIED CONTACT AREA, AND A FIELD EFFECT TRANSISTOR GATE

RELATED PATENT DATA

This patent is a divisional of U.S. patent application Ser. No. 08/562,928, filed Nov. 27, 1995, by Monte Manning, titled "Semiconductor Processing Method of Forming a Buried Contact," and now U.S. Pat. No. 5,681,778.

PATENT RIGHTS STATEMENT

This invention was made with Government support under Contract No. MDA972-92-C-0054 awarded by Advanced Research Projects Agency (ARPA). The government has certain rights in this invention.

TECHNICAL FIELD

This invention relates to semiconductor processing methods of forming buried contacts and to methods of making ohmic contact between a transistor gate line and a substrate diffusion region.

BACKGROUND OF THE INVENTION

Single semiconductor devices are grouped into integrated circuits, which in turn are further densified into large scale integrated semiconductor systems. The trend in semiconductor integrated circuitry fabrication continues to involve a decrease in the size of individual structures. However, this has been accompanied by an increase in the complexity and number of such structures aggregated on a single semiconductor integrated chip.

One type of integrated circuitry comprises memory circuitry. This invention arose out of problems or challenges inherent in producing a particular type of memory circuitry, namely static random access memory (SRAMs). Such circuitry typically interconnects a gate of one transistor device to a diffusion area of another transistor device in a semiconductor substrate. One typical prior art method of accomplishing such fabrication and interconnection is described with reference to FIGS. 1–4. FIG. 1 illustrates a semiconductor wafer fragment 10 in process comprised of a bulk substrate region 12 and field oxide regions 13. A gate oxide layer 14 overlies silicon substrate 12. A conductive polysilicon layer 15 is provided over field oxide regions 13 and gate oxide layer 14. Such will be utilized for fabrication of a transistor gate line of associated SRAM circuitry. A layer 16 of photoresist is provided atop the substrate, and provided with a patterned opening 17 therein.

Referring to FIG. 2, a contact opening 18 to bulk substrate 12 has been etched through polysilicon layer 15 and gate oxide layer 14. A desired diffusion region 20 can be provided as shown. Then, the photoresist layer 16 of FIG. 1 is stripped.

Referring to FIG. 3, a subsequent polysilicon layer 22 is deposited over first polysilicon layer 15 and to within contact opening 18.

Referring to FIG. 4, layers 22 and 15 are patterned and etched to produce the illustrated transistor gate line 24 which extends over and ohmically connects with diffusion region 20.

Although the invention arose out of concerns associated with achieving the above described SRAM interconnect, the artisan will appreciate applicability of the invention to other semiconductor fabrication techniques resulting in formation of buried contacts. Prior art buried contact techniques typically provide field oxide and associated devices fabricated relative to substrate active area. An insulating dielectric layer is subsequently deposited, with contact openings being patterned therethrough to desired diffusion regions within the active area, or to other device components. Aspects of this invention depart from such prior art techniques, with the invention only being limited by the accompanying claims appropriately interpreted in accordance with the doctrine of equivalents.

SUMMARY OF THE INVENTION

In one aspect of the invention, a semiconductor processing method of forming a conductive line over a substrate active area includes forming a buried contact mask within a substrate active area from only a portion of a prior used field oxide mask. With the buried contact mask in place, a conductive line is formed that overlies the substrate active area. In one aspect of the invention, a semiconductor processing method of forming an electrical connection to a buried contact area of a substrate includes forming a buried contact mask in a substrate active area from a prior used field oxide mask. With the buried contact mask in place, a first conductive line is formed over at least some of the active area adjacent the buried contact mask. The buried contact mask is removed to expose a buried contact area. A second conductive line a portion of which overlies the buried contact area is formed to make electrical connection therewith and a portion of which is spaced elevationally from the first conductive line.

In one aspect of the invention, a semiconductor processing method of forming a conductive line over a substrate active area includes forming a buried contact mask over at least a part of the active area from a prior used field oxide mask. At least part of the buried contact mask is insulated with an insulating material. With the buried contact mask in place, a conductive line that overlies the active area is formed. At least part of the conductive line is insulated with insulating material which was formed when the buried contact mask was insulated.

In one aspect of the invention, a semiconductor processing method of forming an electrical connection to a buried contact area of a substrate includes forming a buried contact mask over a substrate active area. The buried contact mask has an exposed peripheral edge. An anisotropically etched electrically insulating sidewall spacer is formed over the exposed peripheral edge of the buried contact mask. The buried contact mask is removed to leave the buried contact area exposed adjacent the sidewall spacer. Conductive material is formed over the sidewall spacer and in electrical connection with the buried contact area.

In one aspect of the invention, a semiconductor processing method of forming a field effect transistor gate over a semiconductor substrate includes forming a gate dielectric layer over substrate active area while a buried contact mask to said active area is in place. A field effect transistor gate is formed over the gate dielectric layer.

Other aspects are contemplated.

BRIEF DESCRIPTION OF THE DRAWINGS

Preferred embodiments of the invention are described below with reference to the following accompanying drawings.

FIG. 5 is a diagrammatic sectional view of a semiconductor wafer fragment at one processing step in accordance with the invention.

FIG. 6 is a view of the FIG. 5 wafer fragment at a processing step subsequent to that shown by FIG. 5.

FIG. 7 is a view of the FIG. 5 wafer fragment at a processing step subsequent to that shown by FIG. 6.

FIG. 8 is a view of the FIG. 5 wafer fragment at a processing step subsequent to that shown by FIG. 7.

FIG. 9 is a view of the FIG. 5 wafer fragment at a processing step subsequent to that shown by FIG. 8.

FIG. 10 is a view of the FIG. 5 wafer fragment at a processing step subsequent to that shown by FIG. 9.

FIG. 11 is a view of the FIG. 5 wafer fragment at a processing step subsequent to that shown by FIG. 10.

FIG. 12 is a diagrammatic sectional view of an alternate embodiment semiconductor wafer fragment at one alternate processing step in accordance with the invention.

FIG. 16 is a view of the FIG. 12 wafer fragment at a processing step subsequent to that shown by FIG. 15.

FIG. 17 is a view of the FIG. 12 wafer fragment at a processing step subsequent to that shown by FIG. 16.

FIG. 18 is a view of the FIG. 12 wafer fragment at a processing step subsequent to that shown by FIG. 17.

DETAILED DESCRIPTION OF THE PREFERRED EMBODIMENTS

Figure 1:
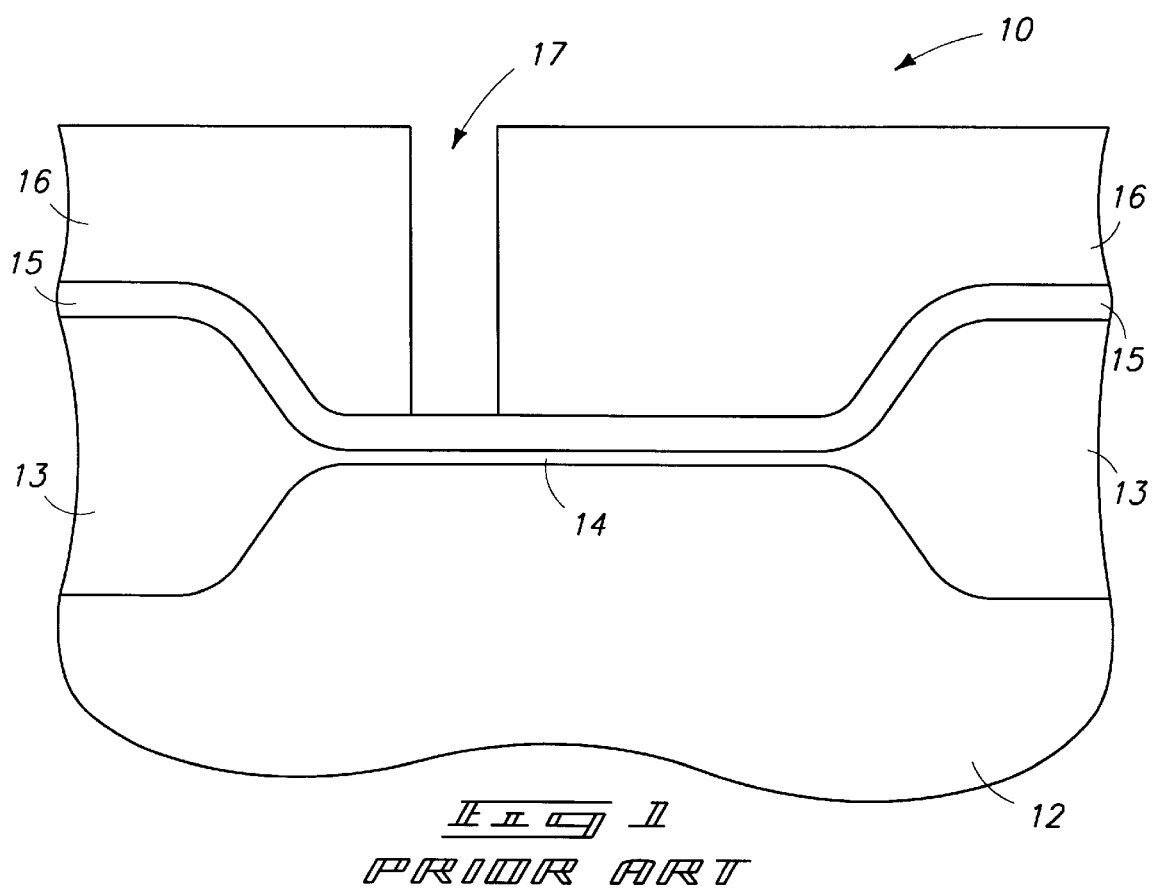
FIG. 1 is a diagrammatic sectional view of a prior art semiconductor wafer fragment at one prior art processing step, and is discussed in the "Background" section above.
Figure 2:
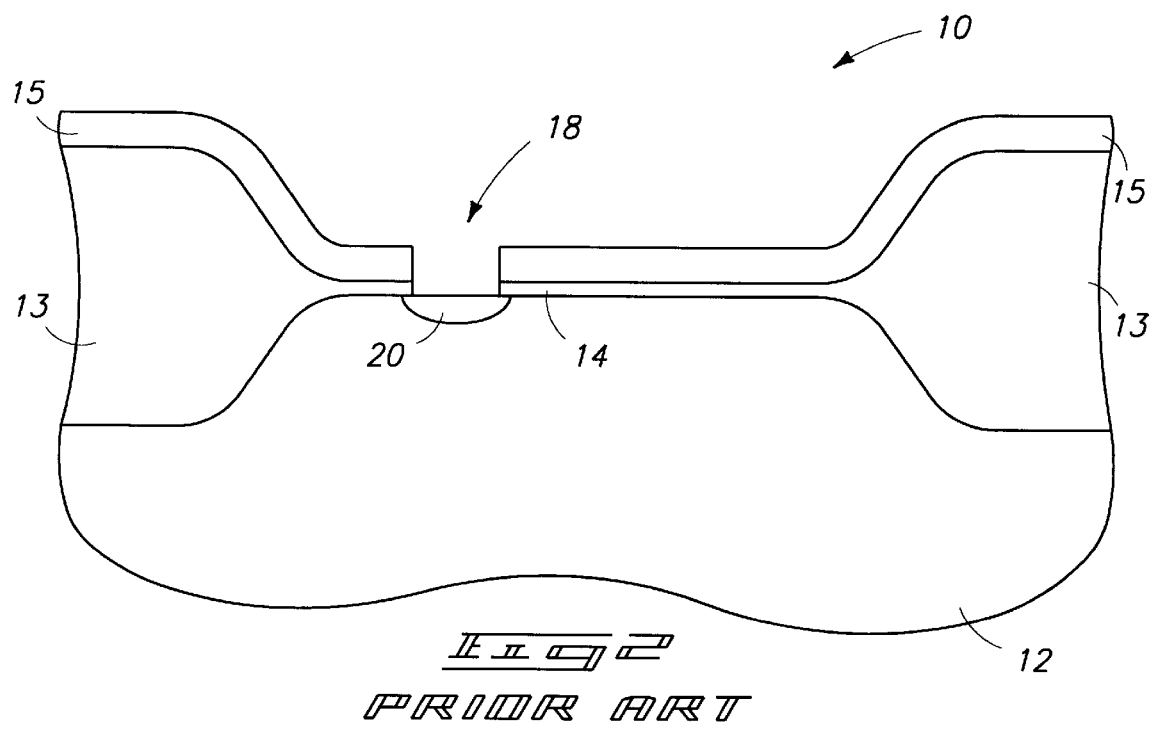
FIG. 2 is a view of the FIG. 1 prior art wafer fragment at a prior art processing step subsequent to that shown by FIG. 1.
Figure 3:
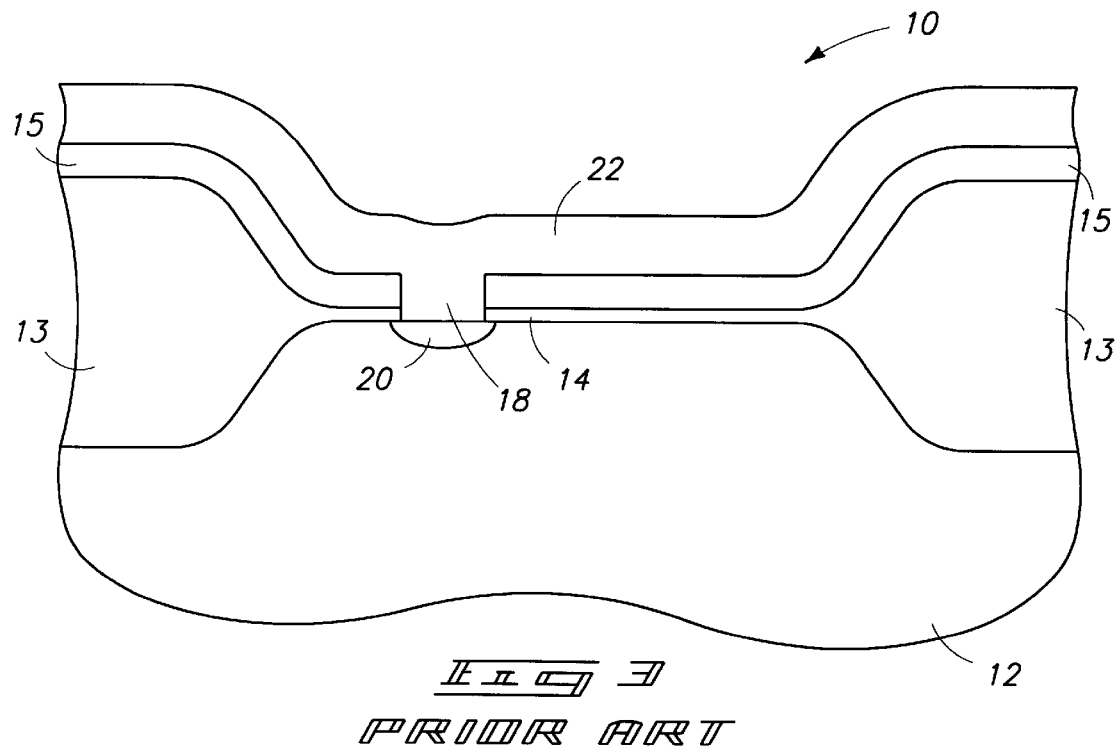
FIG. 3 is a view of the FIG. 1 prior art wafer fragment at a prior art processing step subsequent to that shown by FIG. 2.
Figure 4:
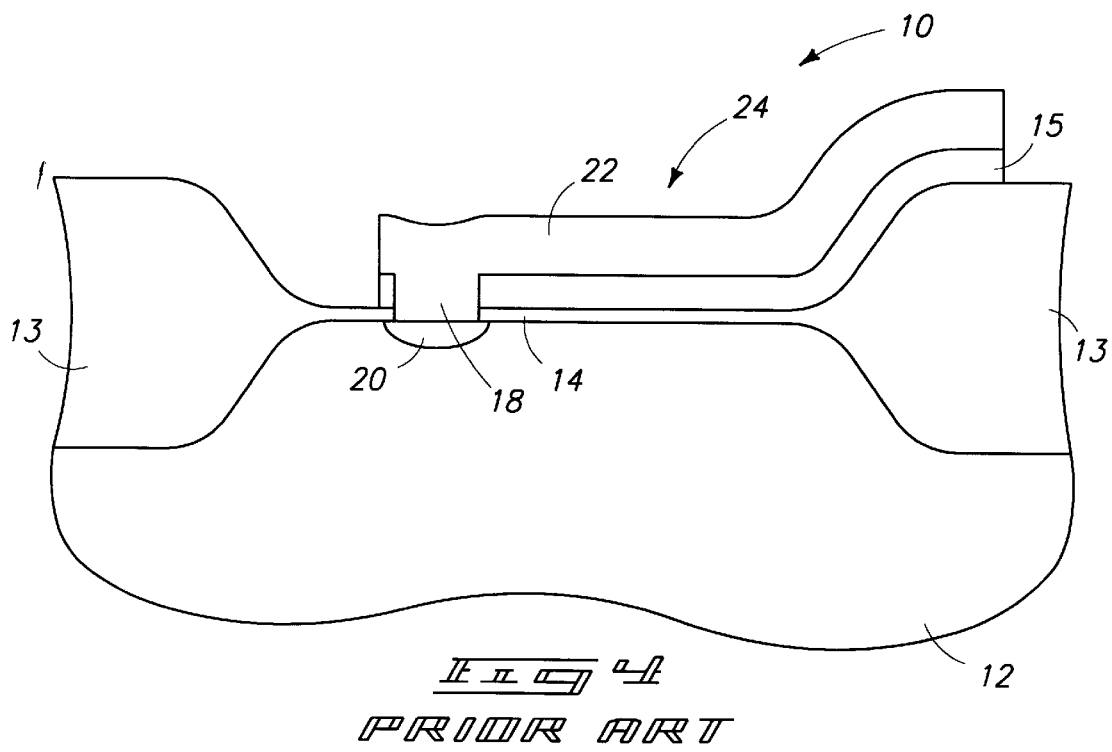
FIG. 4 is a view of the FIG. 1 prior art wafer fragment at a prior art processing step subsequent to that shown by FIG. 3.

Referring to FIGS. 5–11, and initially to FIG. 5, a semiconductor wafer fragment in process is indicated generally with reference numeral 25. Such comprises a bulk semiconductor substrate region 26 (preferably a monocrystalline silicon) and an oxidation masking layer 28 provided thereover. In the preferred process, field oxide regions will be produced by sealed-interface local oxidation (SILO), with layer 28 comprising a SILO masking composite of silicon nitride, low temperature deposited $SiO_2$, and an outer silicon nitride layer. Thus in the most preferred embodiment, oxidizing masking layer 28 comprises nitride, with such nitride being in direct contact with bulk semiconductor substrate 26. Alternately although much less preferred, an intervening pad oxide layer could be provided between masking layer 28 and bulk substrate region 26 in direct contact therewith. An example preferred thickness for composite SILO masking layer 28 is 1200 Angstroms.

Referring to FIG. 6, oxidation masking layer 28 is first patterned and etched to cover desired substrate active area 30 and leave desired substrate field oxide areas 32 exposed.

Referring to FIG. 7, wafer fragment 25 is exposed to oxidation conditions effective to grow field oxide regions 34 and 36 in unmasked field oxide areas 32.

Referring to FIG. 8, the first patterned and etched oxidation masking layer 28 is second patterned and etched to form a buried contact mask 40 on substrate 26 within the illustrated one active area 30. Buried contact mask 40 covers less than all of active area 30 between adjacent field oxide regions 34 and 36. Thus, buried contact mask 40 and thus the resultant buried contact to be formed is effectively aligned relative to an edge or the interface of active area 30 and field oxide region 34. This will be more readily apparent from the continuing discussion.

Referring to FIG. 9, and with buried contact mask 40 in place, a gate dielectric layer 42 is provided on substrate 26 on exposed portions of active area 30. Layer 42 comprises an insulating dielectric layer provided over exposed portions of active area 30. Such area can be provided by a thermal oxidation after a cleaning step. Further, an intermediate step sacrificial oxide growth and strip can be conducted prior to provision of a gate dielectric layer.

Referring to FIG. 10, buried contact mask 40 is removed from substrate 26 thereby effectively exposing bulk substrate buried contact area 44 therebeneath. Subsequently, an electrically conductive transistor gate layer 46 is provided over field oxide regions 34 and 36, and buried contact area 44. Preferably, fragment 25 is subjected to a wet acid clean prior to layer 46 deposition to remove any undesired native oxide which formed relative to buried contact area 44.

Referring to FIG. 11, gate layer 46 is patterned and etched into illustrated transistor gate or interconnect lines 48 and 49, with line 48 overlying both field oxide and buried contact area. An electrical conductivity enhancing impurity is provided into bulk substrate 26 beneath buried contact area 44 to define a substrate diffusion region 50. Thus, patterned gate line 48 is in ohmic electrical communication with diffusion region 50.

Diffusion region 50 might be provided by a number of manners either before or after provision of electrically conductive transistor gate layer 46. For example, diffusion region 50 could be provided by a dedicated masking and implant step, or in association with other desired implants, in advance of layer 46 deposition. Alternately where layer 46 comprises semiconductive material such as polysilicon which is heavily and effectively conductively doped with a conductivity enhancing impurity (i.e. greater than or equal to $1\times10^{20}$ ions/$cm^3$), diffusion region 50 might be provided essentially entirely a result of out-diffusion of such conductivity enhancing impurity from gate layer 46. Such would typically occur as the result of subsequent heating in inherent wafer processing. Alternately, a dedicated anneal at for example 850° C. for 30 minutes could be utilized to drive dopant sufficiently into bulk substrate 26 to form diffusion region 50. Further alternately, diffusion region 50 might be provided by a combination of the above described implant and out-diffusion steps.

The above described process provides an improvement over the described prior art process in that separate multiple polysilicon depositions are avoided.

An alternate embodiment is described with reference to FIGS. 12–18. Like numerals from the first described embodiment are utilized where appropriate, with differences being indicated by the suffix "a" or with different numerals. Wafer fragment 25a in FIG. 12 illustrates a processing step immediately subsequent to that depicted by FIG. 9 in the first described embodiment. A layer 62 of conductively doped polysilicon and subsequent insulating layer 64 (i.e. $SiO_2$) are deposited as shown. Layer 62 will function as a conductive gate line, with layer 64 comprising an insulating cap thereover.

Figure 13:
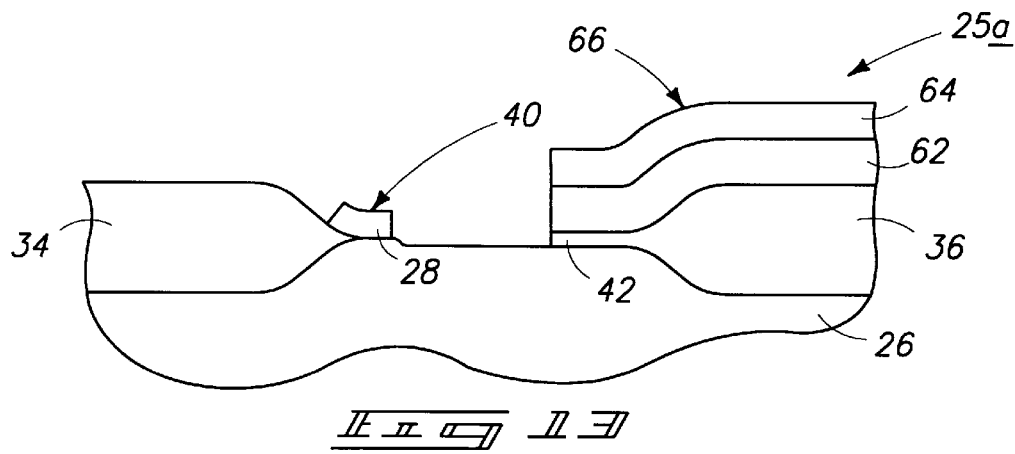
FIG. 13 is a view of the FIG. 12 wafer fragment at a processing step subsequent to that shown by FIG. 12.

Referring to FIG. 13, layers 62 and 64 are patterned into a desired conductive line shape 66. Thus, a first conductive line is provided to extend over at least a portion of active area 30 and adjacent field oxide, with buried contact mask 40 remaining in place during such provision.

Figure 14:
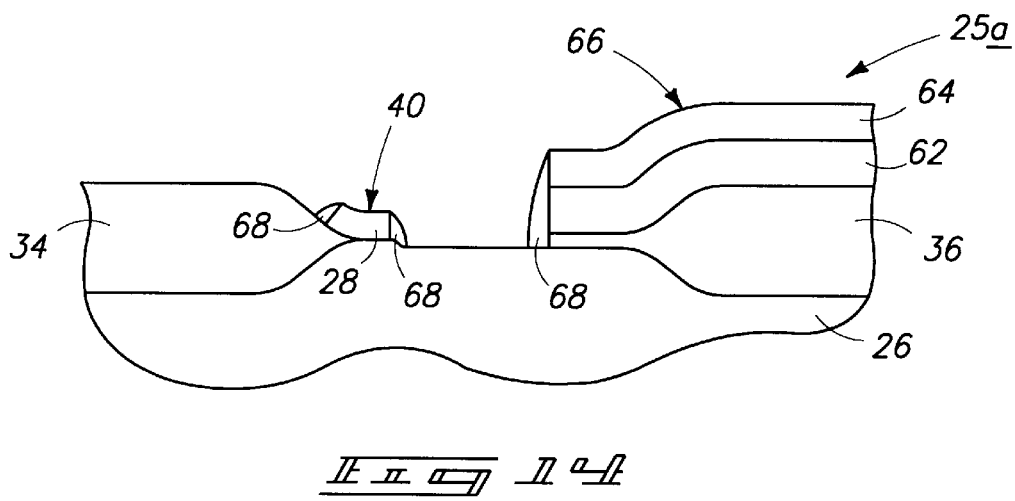
FIG. 14 is a view of the FIG. 12 wafer fragment at a processing step subsequent to that shown by FIG. 13.

Referring to FIG. 14, an insulating layer (preferably SiO$_2$) is deposited and anisotropically etched to produce the illustrated oxide spacers 68. Thus with buried contact mask 40 in place, electrically conductive line 66 is effectively electrically insulated.

Figure 15:
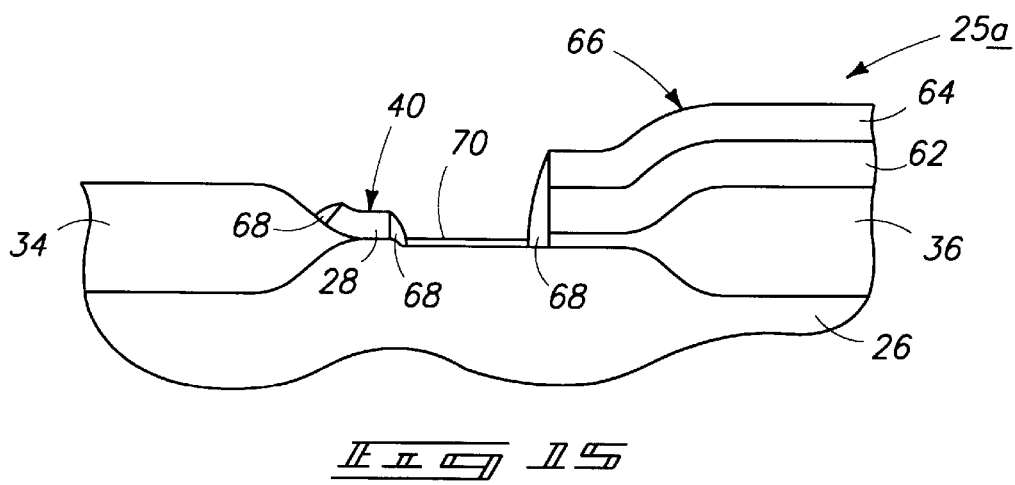
FIG. 15 is a view of the FIG. 12 wafer fragment at a processing step subsequent to that shown by FIG. 14.

Referring to FIG. 15, a dielectric layer 70 is provided within active area 30 over unmasked or uncovered substrate 26 area. Such is preferably provided by a wet oxidation of the substrate to grow such oxide.

Referring to FIG. 16, patterned buried contact mask 40 is stripped or otherwise removed from substrate 26 and effectively leaving buried contact area 44 therebeneath outwardly exposed.

Referring to FIG. 17, a layer 72 of electrically conductive material (preferably conductively doped polysilicon) is provided over the illustrated field oxide insulated first conductive line 66 and exposed buried contact area 44. Again preferably, the wafer is subjected to a cleaning step to remove any native oxide within buried contact area 44 prior to provision of layer 72.

Referring to FIG. 18, conductive material layer 72 is patterned and etched into a second conductive line 75 which overlies buried contact area 44. Accordingly, such provides but one example of a method whereby the buried contact masking is provided for connection with higher levels of conductive material as opposed to an initially deposited conductive material layer.

The above described first preferred embodiment was with respect to making ohmic contact between a transistor gate line and a substrate diffusion region. The artisan will however appreciate applicability of the invention to forming any buried contact prior to field oxidation, with the field oxidation mask also effectively masking a desired buried contact area on a bulk semiconductor substrate. Removal of the oxidation masking layer enables subsequent provision of a conductive line layer to overlie the buried contact area, and thus make electrical connection therewith.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming a buried contact to a substrate region comprising the following steps:

providing a masking layer over a bulk semiconductor substrate;

with the masking in place, exposing the substrate to oxidation conditions effective to grow field oxide regions in unmasked areas of the substrate and define active area substrate regions in masked areas;

after forming the field oxide regions, patterning the masking layer within at least one of the active area regions to form a buried contact mask on the substrate within the at least one active area;

with the buried contact mask in place, providing a first conductive line extending over the at least one active area and field oxide;

with the buried contact mask in place, electrically insulating the first conductive line;

with the buried contact mask in place, providing a dielectric layer within the at least one active area over unmasked substrate area;

after providing the dielectric layer, removing the patterned buried contact mask from the substrate and effectively leaving buried contact area therebeneath exposed;

providing a layer of electrically conductive material over field oxide, the insulated first conductive line and exposed buried contact area; and patterning the conductive material layer into a second conductive line which overlies the buried contact area.

2. The semiconductor processing method of forming a buried contact of claim 1 wherein the buried contact is formed to be self-aligned to an edge of the one active area.

3. The semiconductor processing method of forming a buried contact of claim 1 wherein the oxidizing masking layer comprises nitride which is in direct contact with the bulk semiconductor substrate.

4. The semiconductor processing method of forming a buried contact of claim 1 wherein the buried contact is formed to be self-aligned to an edge of the one active area, and the oxidizing masking layer comprises nitride which is in direct contact with the bulk semiconductor substrate.

5. A semiconductor processing method of forming a conductive line over a substrate active area comprising:

forming a buried contact mask within a substrate active area from only a portion of a prior used field oxide mask; and with the buried contact mask in place, forming a conductive line that overlies the substrate active area.

6. The semiconductor processing method of claim 5 further comprising prior to forming the conductive line, forming a gate dielectric layer over the substrate active area adjacent the buried contact mask.

7. The semiconductor processing method of claim 5 further comprising electrically insulating the conductive line and thereafter forming a dielectric layer within the substrate active area.

8. The semiconductor processing method of claim 5 wherein the step of forming the conductive line comprises:

forming a conductive layer over the buried contact mask; and patterning and etching the conductive layer to form the conductive line.

9. The semiconductor processing method of claim 5 wherein the step of forming the conductive line comprises:

forming a conductive layer over the buried contact mask;

forming an insulating layer atop the conductive layer; and patterning and etching the conductive and insulating layers using a common masking step to form the conductive line.

10. The semiconductor processing method of claim 5 wherein the step of forming the conductive line comprises:

forming a conductive layer over the buried contact mask;

forming an insulating layer atop the conductive layer;

patterning and etching the conductive and insulative layers using a common masking step to form a first conductive line; and forming a second conductive line atop the first conductive line.

11. The semiconductor processing method of claim 5 wherein the step of forming the conductive line comprises:
   forming a conductive layer over the buried contact mask;
   forming an insulating layer atop the conductive layer;
   patterning and etching the conductive and insulative layers using a common masking step to form a first conductive line; and
   forming a second conductive line atop the first conductive line, the step of forming the second conductive line comprising:
   forming an insulating layer over the first conductive line;
   with the buried contact mask in place, forming a conductive material layer over the first conductive line and the buried contact mask; and
   patterning the conductive material layer into the second conductive line.

12. A semiconductor processing method of forming an electrical connection to a buried contact area of a substrate comprising:
   forming a buried contact mask in a substrate active area from a prior used field oxide mask;
   with the buried contact mask in place, forming a first conductive line over at least some of the active area adjacent the buried contact mask;
   removing the buried contact mask to expose a buried contact area; and
   forming a second conductive line a portion of which overlies the buried contact area to make electrical connection therewith and a portion of which is spaced elevationally from the first conductive line.

13. A semiconductor processing method of forming a conductive line over a substrate active area comprising:
   forming a buried contact mask over at least a part of the active area from a prior used field oxide mask, at least part of the buried contact mask being insulated with an insulating material; and
   with the buried contact mask in place, forming a conductive line that overlies the active area, at least part of the conductive line being insulated with insulating material which was formed when the buried contact mask was insulated.

14. The semiconductor processing method of claim 13 wherein the buried contact mask and the conductive line are laterally spaced from one another, and further comprising forming a dielectric layer between the buried contact mask and the conductive line.

15. The semiconductor processing method of claim 13 wherein the buried contact mask and the conductive line are laterally spaced from one another, and further comprising:
   removing the buried contact mask to expose a buried contact area; and
   forming a second conductive line a portion of which overlies the buried contact area and forms an electrical connection therewith, and a portion of which is elevationally spaced from the other conductive line.

16. A semiconductor processing method of forming a conductive line over a substrate active area comprising:
   forming a buried contact mask over at least a part of the active area from a prior used field oxide mask;
   with the buried contact mask in place, forming a first conductive line that overlies the active area, the conductive line having a terminus laterally spaced from the buried contact mask;
   insulating at least a part of the buried contact mask and the first conductive line terminus in a common insulating step;
   removing the buried contact mask to expose a buried contact area; and
   forming a second conductive line a portion of which overlies the buried contact area to make electrical connection therewith, and a portion of which is elevationally spaced from the first conductive line.

17. The semiconductor processing method of claim 16 further comprising prior to forming the second conductive line, forming a dielectric layer over at least some of the active area extending between the buried contact mask and the first conductive line terminus.

18. A semiconductor processing method of forming an electrical connection to a buried contact area of a substrate comprising:
   forming a buried contact mask over a substrate active area, the buried contact mask having an exposed peripheral edge;
   forming an anisotropically etched electrically insulating sidewall spacer over the exposed peripheral edge of the buried contact mask;
   removing the buried contact mask to leave the buried contact area exposed adjacent the sidewall spacer; and
   forming conductive material over the sidewall spacer and in electrical connection with the buried contact area.

19. A semiconductor processing method of forming a field effect transistor gate over a semiconductor substrate comprising:
   forming a gate dielectric layer over substrate active area while a buried contact mask to said active area is in place; and
   forming a field effect transistor gate over the gate dielectric layer.

20. The semiconductor processing method of claim 19, wherein the field effect transistor gate is formed while the buried contact mask is in place.

* * * * *

UNITED STATES PATENT AND TRADEMARK OFFICE
CERTIFICATE OF CORRECTION

PATENT NO. : 6,040,221
DATED : March 21, 2000
INVENTOR(S) : H. Montgomery Manning It is certified that error appears in the above-indentified patent and that said Letters Patent is hereby corrected as shown below:

Col. 3, line 45
replace "Please add new paragraph"
with --This disclosure of the invention is submitted in furtherance of the constitutional purposes of the U.S. Patent Laws "to promote the progress of science and useful arts" (Article 1, Section 8).--.

Signed and Sealed this

Twentieth Day of March, 2001

Attest:

NICHOLAS P. GODICI

Attesting Officer     Acting Director of the United States Patent and Trademark Office